United States Patent
Campagna et al.

(10) Patent No.: US 10,151,821 B2
(45) Date of Patent: Dec. 11, 2018

(54) SYSTEM CALIBRATION IN AN MR SYSTEM

(71) Applicant: Siemens Aktiengesellschaft, Munich (DE)

(72) Inventors: Swen Campagna, Engelthal (DE); Michael Wullenweber, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 718 days.

(21) Appl. No.: 14/729,538

(22) Filed: Jun. 3, 2015

(65) Prior Publication Data

US 2015/0346309 A1 Dec. 3, 2015

(30) Foreign Application Priority Data

Jun. 3, 2014 (DE) .................. 10 2014 210 417

(51) Int. Cl.
*G01R 33/58* (2006.01)
*G01R 33/3875* (2006.01)
*G01R 33/54* (2006.01)

(52) U.S. Cl.
CPC ......... *G01R 33/583* (2013.01); *G01R 33/543* (2013.01); *G01R 33/3875* (2013.01); *G01R 33/546* (2013.01)

(58) Field of Classification Search
CPC .. G01R 31/40; G01R 31/2841; G01R 31/001; G01R 31/2889
USPC .................... 324/750.01, 500, 537
See application file for complete search history.

(56) References Cited

U.S. PATENT DOCUMENTS

| | | | |
|---|---|---|---|
| 7,019,535 B2* | 3/2006 | Adamian | G01R 35/005 324/601 |
| 2004/0246004 A1* | 12/2004 | Heuermann | G01R 27/32 324/601 |
| 2007/0041511 A1* | 2/2007 | Tan | G01R 13/029 379/30 |
| 2007/0276614 A1* | 11/2007 | Tan | G01R 27/32 702/55 |
| 2008/0004819 A1* | 1/2008 | Namba | G01R 27/28 702/65 |
| 2013/0187650 A1 | 7/2013 | Pfeuffer et al. | |
| 2017/0060150 A1* | 3/2017 | Stefanski | G05D 23/27 |
| 2018/0036740 A1* | 2/2018 | Nelson | B02C 19/18 |
| 2018/0059176 A1* | 3/2018 | Ding | G01R 1/0433 |

\* cited by examiner

*Primary Examiner* — Giovanni Astacio-Oquendo
(74) *Attorney, Agent, or Firm* — Schiff Hardin LLP

(57) ABSTRACT

In a method for making calibration measurements in a magnetic resonance (MR) system, in order to acquire an MR image of an examination subject, wherein the MR unit has a computer for operating the MR scanner, and a system control computer designed to control multiple system components of the MR scanner, a preparation step is executed by the computer to prepare a first calibration step, in which a first parameter of a system component is matched to the examination subject via the system control computer, and to prepare a second calibration step, in which a second parameter of a system component is matched to the examination subject via the system control computer. The first calibration step is executed by the system control computer as is the second calibration step. The preparation step is executed by the computer to prepare one of the first or second calibration steps before one of the calibration steps is initiated by the system control computer.

11 Claims, 4 Drawing Sheets

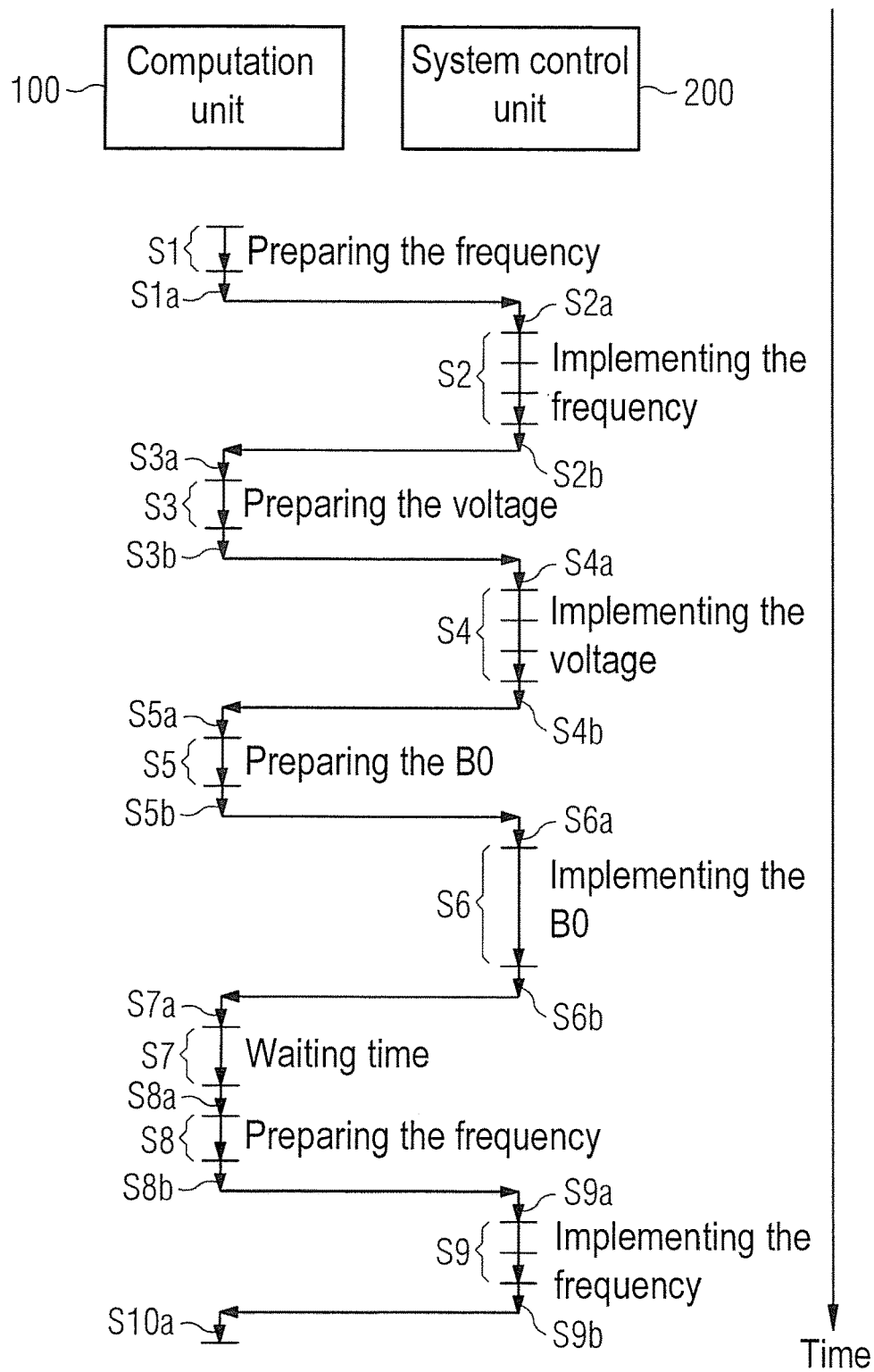

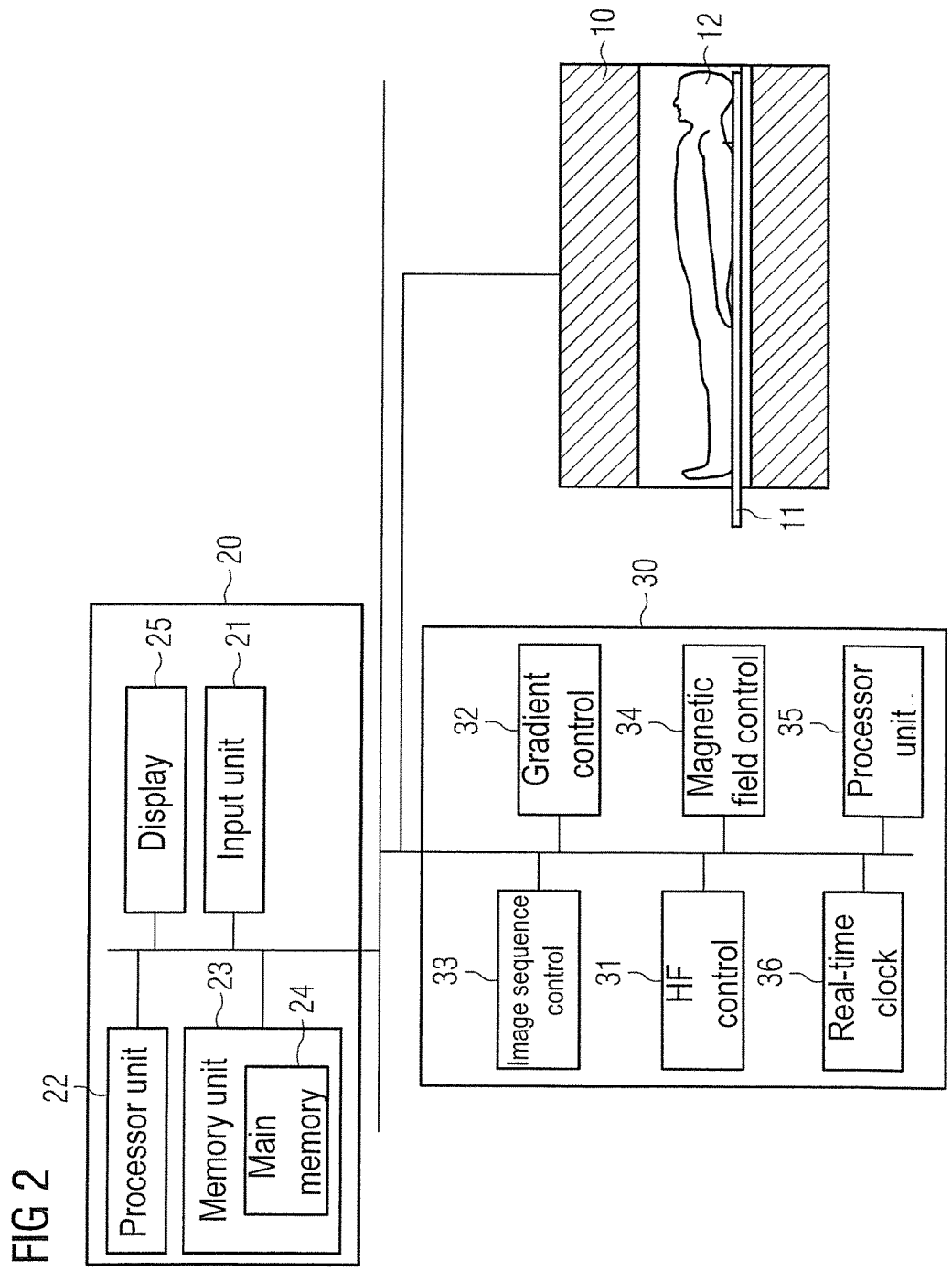

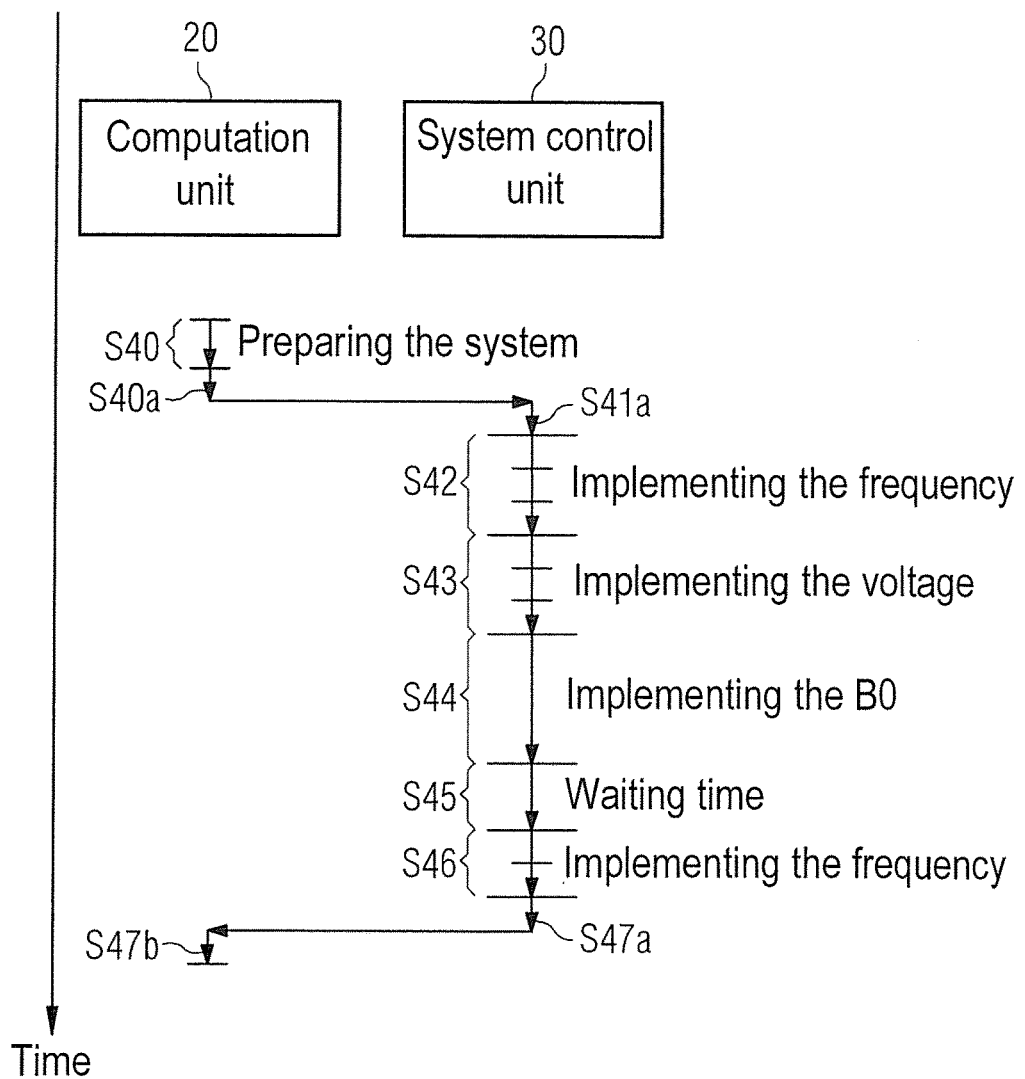

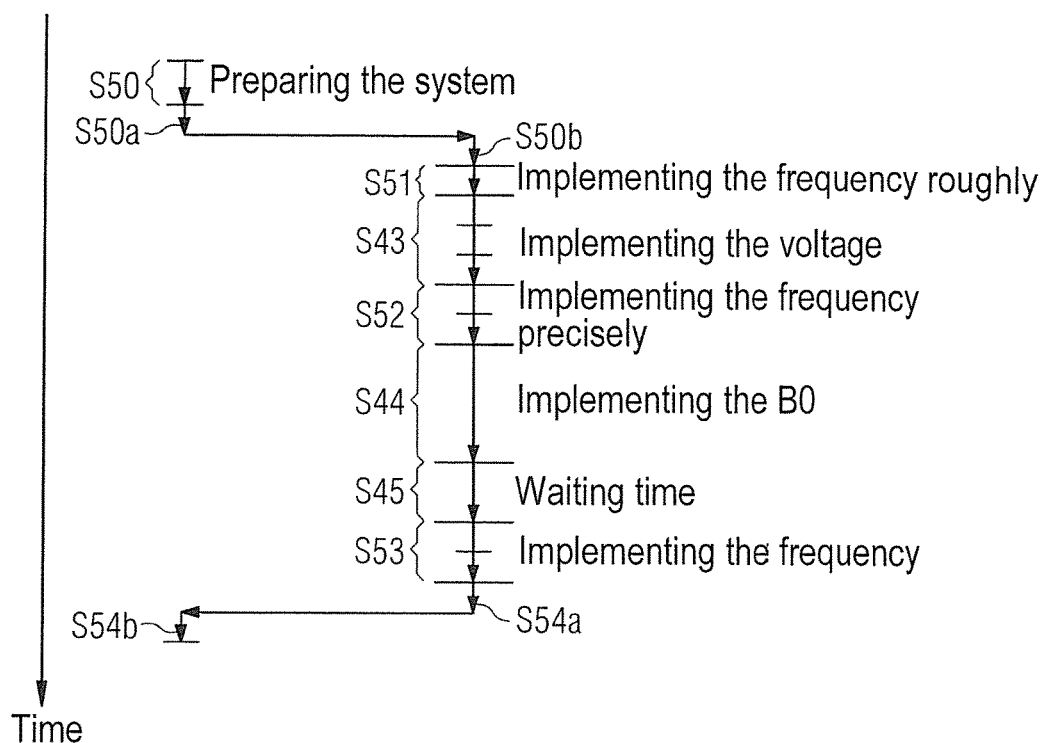

SYSTEM CALIBRATION IN AN MR SYSTEM

BACKGROUND OF THE INVENTION

Field of the Invention

The present invention concerns a method for carrying out calibration measurements in an MR system, as well as an MR system for implementing such a method.

Description of the Prior Art

In MR systems, in order to acquire an MR image, the MR signals must be acquired using system parameters such as the resonance frequency, transmitter reference amplitude, or the polarization field B0, have to be adjusted to the test subject in order to be able to obtain meaningful MR images of the test subject. In order to determine the parameters for these system components, a stand-alone calibration step is carried out in each case. This usually involves a specific stand-alone MR measurement and an evaluation provided therefor. Within such an MR measurement, which is carried out in a system control computer, the time schedule can be set and carried out in the sub-microsecond range. This is relevant, for example, when the calibration step is formed by multiple sub-steps that are dependent on one another and, for example, executed in repeated iterations that require a specific time delay between them. Each MR measurement is prepared in a computer, the "host-computer", and after an unknown and varying time delay, the MR measurement is initiated by the system control computer after the computer has informed the system control computer that and how the measurements are intended to be carried out.

FIG. 1 shows the procedure for such a calibration measurement in the prior art. In a step S1, a preparation step is carried out on a computer 100 of the MR system, which is operated by a user of the MR system in order to control the MR system. In this step, the determination of an MR center frequency for adjusting the MR system to a test subject is prepared. When adjusting the center frequency, the maximum of the frequency or the resonance frequency of water, known as the Larmor frequency for the test subject in the MR system is determined. Knowledge of the exact frequency is important, for example, when determining the frequency of an RF pulse that is radiated by the MR system onto the test subject. This preliminary or preparation step S1 includes, inter alia, loading program files into the main memory of the computer, allocating storage space in the program memory, etc. After preparing for this calibration step by running the program file that is intended to carry out the frequency calibration, there is a time delay, shown in step S1$a$, before the computer 100 commands the system control computer 200 to carry out the calibration of the frequency. Communication between the computer 100 and the system control computer 200 is necessary for this before the frequency calibration can finally be carried out in step S2. There is a further time delay S2$a$, which is needed to transmit the information to the system control computer and to prepare the measurement itself on the system control computer, until the measurement can finally be initiated in step S2. In step S2$b$ the computer is informed in step S2 that the frequency calibration has been completed. Before the computer 100 can carry out the preparation for a further calibration step to adjust the transmitter voltage in step S3, there is a further time delay, labelled as step S3$a$. As in step S1, the preparation includes loading the respective program sections into the main memory, etc. Before this calibration of the voltage can be carried out in step S4, there are again time delays for the required communication and preparation, shown by step S3$b$ and step S4$a$. The computer is again informed of the end of this calibration step and, before a polarization field B0 can be adjusted to the test subject step S5, there are again time delays S4$b$ and S5$a$. After the preparation for this adjustment has been completed in step S5, there are time delays S5$b$ and S6$a$, before the B0 field can be adjusted to the test subject in step S6, for example, by switching the currents in shim coils provided for this purpose, which compensate for any magnetic field inhomogeneities so that the polarization field B0 is as homogeneous as possible across the measurement field. After completion of step S6, the time delays S6$b$ and S7$a$ are required for communication between the computer 100 and the system control computer 200. Until the currents in the shim coils have finally stabilized to homogenize the polarization field B0, there is a waiting time in step S7. Following this, after a time delay S8$a$ in step S8, a further frequency calibration can be prepared, which can again be initiated by the system control computer in step S9 after the time delays S8$b$ and S9, the time delay in steps S8$b$ and S9$b$ again being due to communication between units 100 and 200. After completion of the frequency adjustment in step S9, there follows in step S9$b$ and in S10$a$ information on the end of the calibration steps, until the system is ready to start the actual MR measurement, after completion of step S10$a$.

The individual preparation phases and time delays that result inter alia from communication between the two units extend the overall time required for the calibration measurements.

SUMMARY OF THE INVENTION

An object of the present invention is to provide a method for carrying out calibration measurements that is accelerated compared to known methods.

According to a first aspect of the invention, a method is provided for carrying out calibration measurements in an MR system, wherein the calibration measurements are carried out to acquire an MR image of a test subject. The MR system has a computer to operate the MR system through a user, and a system control computer, which is designed to control a plurality of system components in the MR system. According to one step in the method, a preparation step is carried out on the computer to prepare a first calibration step, in which the system control computer calibrates a first parameter of a system component to the test subject. Furthermore, in the preparation step, a second calibration step is prepared, in which a second parameter of a system component is adjusted to a test subject by the system control computer. Finally the first calibration step is carried out by the system control computer and the second calibration step is carried out by the system control computer, the preparation step on the computer to prepare a first and second calibration step being completed before one of the calibration steps is initiated by the system control computer.

This means that the individual calibration steps are prepared in a single preparation step. This leads to a saving of time since, inter alia, less communication is necessary between the computer and the system control computer. Furthermore, the procedure is easier to plan since less communication is necessary between the computer and the system control computer. The duration of this communication cannot be determined beforehand. Since overall there are fewer steps that have an indefinite duration, the adjustment steps are easier to predict.

The preparation step may be, inter alia, the loading of a program file containing executable commands into a main memory of the computer, the system control computer being prompted to carry out the first calibration step by the commands stored in the program file. Similarly, the preparation step comprises the loading of a second program file containing executable commands into the main memory of the computer, the system control computer being prompted to carry out the second calibration step by the second program file. Furthermore, the preparation step may include allocating storage space in the main memory of the computer for the first and second program file and informing the system control computer that the first and the second calibration steps are to be carried out. The preparation step may further include placing a receive chain in a receiving unit of the MR system and the setting of possible commands that are issued to a couch control in order to move a couch on which the test subject is arranged.

The first calibration step may be, for example, an adjustment to a center frequency of an RF transmission unit for radiating the RF pulse into the test subject. The second calibration step may include an adjustment of a voltage, the transmitter voltage, with which the RF transmission unit generates the RF pulse that is radiated into the test subject. By having a calibrated frequency for the RF pulse, it is ensured that the RF pulse radiated is resonant with the magnetization in the test subject and it is established by means of the adjustment of the transmitter voltage, as to which tilt angle is achieved with which voltage amplitude during magnetization in the test subject. In addition, a third calibration step may be carried out by the system control computer, in which the polarization field B0 is adjusted to the test subject such that a change in the polarization field B0 caused by the test subject is minimized. The preparation step carried out in the computer may also include this third calibration step, the preparation step being completed before one of the three calibration steps is initiated by the system control computer.

The calibration steps are preferably carried out in numerical order, that is, the first calibration step before the second and the second calibration step before the third calibration step. This sequence is sensible, as it is first necessary to check what the resonance frequency is before the transmitter voltage is adjusted. The B0 field optimization can then be carried out.

It is further possible for the first calibration step to be repeated by the system control computer after the third calibration step, in a fourth calibration step. That is, after the adjustment of the polarization field in the third calibration step, the resonance frequency is again adjusted to the potentially changed polarization field B0. In the preparation step on the computer, the preparation of the first to fourth calibration steps is now carried out in a single preparation step, before one of the calibration steps is initiated by the system control computer.

As a result of the fact that less time needs to be expended on the calibration, various calibrations can also be combined or entangled with one another. For example, the first calibration step involving the adjustment of the center frequency may comprise a first partial step with a first fairly rough determination of the center frequency, which is followed by the second calibration step comprising the adjustment of the transmitter voltage. After this adjustment of the transmitter voltage, a second partial step of the first calibration step may ensue, in which there is a more precise determination of the center frequency, which is more precise that the first fairly rough determination. The preparation step encompasses in this example the preparation of the first and second partial step and the preparation is completed before one of the calibration steps is initiated by the system control computer.

Preferably, all the calibration steps that are necessary before carrying out an MR measurement to acquire an MR image are prepared in a single preparation step, such that all the calibration steps can be carried out after this without the computer having to be involved in the meantime before the end of the calibration step.

The invention further concerns an MR system designed for this purpose, having a system control computer that is designed to control multiple system components of the MR system, and which is designed to adjust a first parameter of a system component of the MR system to the test subject in a first calibration step, with the system control computer adjusting a second parameter of a system component to the test subject in a second calibration step. The computer, with which an operator or user operates the MR system, is designed in this case such that the preparation step for the calibration steps is carried out in the computer before the system control computer initiates one of the calibration steps. The system control computer preferably has a real-time clock, with which the procedure is clocked in most of the system components. As a result thereof, it becomes possible to plan the execution of the calibration measurement precisely in the microsecond range. The unplannable time delays that occur for the communication between the computer and system control computer are still only minimal, and all the calibration steps can be carried out one after another with precise time-planning. The system control computer can adjust, inter alia, the following system components and parameters: an RF control unit, which radiates the RF pulse into the test subject with a voltage to be adjusted, wherein the RF pulse has a center frequency that is to be adjusted; furthermore, a magnetic field control is provided as a component that minimizes the changes in the polarization field B0 due to the test subject with the aid of shim coils, for example.

BRIEF DESCRIPTION OF THE DRAWINGS

FIG. 1 is a flowchart for carrying out calibration measurements, as known in the prior art.

FIG. 2 is a block diagram of an MR system with which the execution of calibration measurements according to the invention is optimized.

FIG. 3 shows a time schedule for optimized execution of calibration measurements according to one aspect of the invention.

FIG. 4 shows a further flowchart for carrying out calibration measurements according to a further aspect of the invention.

DETAILED DESCRIPTION OF THE INVENTION

FIG. 2 shows a black diagram of an MR system with which, as will be explained in detail, calibration measurements can be carried out in a time-optimized manner. The MR system has a scanner with a magnet 10 for generating a polarization field B0, an examination subject 12 arranged on a bed 11 being moved into the MR scanner or into the magnet 10 in order to acquire data for MR images of a partial area of the examination subject 12. The MR system has a computer 20, with which an operator can operate and control the MR system. The computer 20 has an input unit (interface) 21, via which the operator can make inputs, such as, for example, the selection of imaging sequences or the positioning of slices. A processor 22 is provided for control of the computer. In a memory unit 23 there are, together with pre-stored imaging sequences, program files, which initiate calibration steps in a system control computer 30 when they are carried out in the processor 22. The memory unit 23 has a main memory 24, which is used by the processor unit 22 when in operation to process programs. On a display 25, MR images can be displayed, and/or the operator can be informed about operating parameters or operating conditions in the MR system. The computer 20 can also be described as the host computer for the MR system. The MR system further has a system control computer 30, with which some system components of the MR system are controlled. The system control computer has an RF control 31, in which the generation of the RF pulses that are radiated into the test subject is controlled. The RF control comprises, for example, an RF transmission unit, which is not shown, and an RF generator for generating RF pulses, which is not shown. In addition to the RF control 31, a gradient control 32 is provided for the control of the magnetic field gradients that are used for the spatial encoding of the MR signals that have been detected. An image sequence control 33 controls the sequence of the RF pulses radiated and magnetic field gradients, and thus controls inter alia the RF control 31 and the gradient control 32. A magnetic field control 34 is responsible for the homogeneity of the polarization field B0 and in this magnetic field control shim currents are calculated in shim coils, which are not shown, and applied, with the magnetic fields generated by the shim coils compensating for magnetic field inhomogeneities in the polarization field B0. A processor unit 35 controls the procedure in the system control computer 30. The system control computer further has a real-time clock 36, with which the exact sequence of the RF pulses and magnetic field gradients can be established with microsecond precision, and which can be used by the processor unit 35 to control the various units 31-34.

It is known to those skilled in the art how MR signals are generated in different ways by radiating RF pulses and applying magnetic field gradients, how the MR signals are detected, and how MR images are calculated therefrom, so this need not be described in greater detail herein. The MR system shown in FIG. 2 has further components are not included in FIG. 2 for clarity, and that are not significant for understanding the invention. For example, in the magnet 10, the MR system has gradient coils to generate the magnetic field gradients and likewise RF coils to transmit the RF pulses and also to detect the MR signals. The functional units shown in FIG. 2 do not have to be implemented with the separation into different units that is shown. Some of the functional units may be combined in one unit. Furthermore, the units shown in FIG. 2 can be implemented using hardware, software or a combination of hardware and software.

As explained below, the computer 20 and the system control computer 30 in particular are programmed in order to achieve an optimized execution of calibration measurements before the start of the measurements to acquire MR images. In particular, the preparation of the calibration steps in the computer is carried out in one single preparation step.

FIG. 3 shows the interaction between the computer 20 and the system control computer 30. In a step S40, a preparation step is carried out in the computer 20. All the calibration steps that are to be carried out later by the system control computer are prepared in this preparation step, for example, allocating storage space in the main memory, loading into the main memory the relevant program files that are necessary to carry out the individual calibration steps, informing the individual system components that a measurement will be initiated soon, etc. In steps S40a and S41a, after the end of the preparation step, information is transmitted to system control computer which it needs to carry out all the calibration steps that are necessary before capturing MR data for the MR image. In step S42, the frequency calibration is then carried out, in which a center frequency of the transmission unit is adjusted to the Larmor frequency of the test subject. In step S43 there then ensues the calibration of the voltage, in which the transmitter voltage in the RF control 31 is adjusted to the parameters of the current measurement. In particular a check is carried out here to determine what transmitter voltage is required. In step S44, the B0 field optimization is then carried out by, for example, measuring the inhomogeneities and by determining the currents that are required in the shim coils to compensate for these inhomogeneities. In step S45 there is a predetermined time delay until said B0 field optimization has become established, that is, until the currents in the shim coils have stabilized and are generating a constant balanced magnetic field. After the end of S45, in step S46 there then follows calibration to the center frequency. Since the calibration of the magnetic field in step S45 has a direct impact on the Larmor frequency, the frequency of the transmission pulse that is generated by the RF control 31 is optimized once again in a step S46. Information is subsequently transmitted to the computer in step S47 and S47b to the effect that the calibration measurements have been completed in full.

If the course of the procedure in FIG. 3 is compared with that in FIG. 1, it is evident that it was possible to reduce the time required for the overall time schedule. In particular, far fewer steps are necessary for the communication between the computer and the system control computer. Furthermore, it is possible to set the time schedule precisely in the system control computer since the timing of the individual calibration steps in the system control computer 30 can be defined very precisely in the microsecond range. In the embodiment shown in FIG. 3, any imponderables, such as the unpredictable duration of communication with a computer, are avoided after the start of the calibration steps. It merely remains necessary to wait for the exact time required, for the waiting time in step S45, for example, so that unnecessary waiting times are minimized and a procedure that runs with maximum precision can be guaranteed.

As is shown in FIG. 4, it is consequently also possible to interleave the individual calibration steps with one another. For example, it may be advisable to determine the frequencies only coarsely before carrying out the transmitter voltage calibration and to carry out a better, fine calibration of the resonance frequency on the basis of a transmitter voltage calibration that is determined after that. In a step S50, the preparations for the individual calibration steps then ensue again on the computer, the adaptation of the transmitter voltage and the adaptation of the B0 field being achieved as in FIG. 3 and being denoted by the same reference signs as with S43 or S44. Instead of a precise frequency determination, a fairly coarse frequency determination can be carried out after the time intervals S50a and S50b for the transmission of information to the system control computer in step S51, followed in step S52 by a more precise frequency determination, in which the center frequency is determined more precisely than in step S51. The waiting time after the adjustment of the B0 field is again similar to step S45 and corresponds to this step in this respect, whilst in step S53 a further adjustment of the center frequency ensures after the adjustment of the B0 field. Since the frequency determination in step S52 and S51 is more precise altogether than in the comparable step S42, it is possible that the frequency determination in step S53 may not necessarily correspond to the frequency determination in step S46. In steps S54a and S54b, the method is terminated by informing the computer that the calibration steps have been completed.

In summary, a simpler, time-saving calibration measurement is possible since the unpredictable time intervals that occur in particular during communication between the computer and the system control computer are minimized and now continue to occur only at the start and end of the calibration steps.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for making a calibration measurement in a magnetic resonance (MR) apparatus, said MR apparatus comprising an MR scanner comprising a plurality of scanner components, a computer interface operable by a user, and a system control computer configured to control said scanner components, said method comprising:

in said computer interface, executing a preparation step, for an image acquisition by said MR scanner from an examination subject situated in the MR scanner, to prepare a first calibration step that will be executed by the system control computer to adjust a first parameter of one of said scanner components relative to the examination subject, and to prepare a second calibration step, which will also be executed by the system control computer, to adjust a second parameter of one of said scanner components relative to the examination subject;

in said computer interface, generating interface signals representing the prepared first and second calibration steps and emitting said interface signals from said computer interface to said system control computer;

in said system control computer, using said interface signals to generate control signals that change said MR scanner from an uncalibrated state to a calibrated state in order to operate said MR scanner in said calibrated states so as to execute said first calibration step and said second calibration step, and emitting said control signals from said system control computer to said MR scanner and thereby initiating execution of said first and second calibration steps by said MR scanner, with said preparation step being completed in said computer interface before execution of one of said first and second calibration steps is initiated by said system control computer; and with said system control computer, operating said MR scanner in said calibrated state in order to obtain MR data from the examination subject, and reconstructing image data from the acquired MR data, and displaying the image data at a display screen as an MR image of the examination subject.

2. The method as claimed in claim 1 comprising, in said preparation step executed by said computer interface, executing at least one of:

loading a first program file that contains executable commands into a main memory of said computer interface, said commands in said first program file being configured to prompt said system control computer to execute said first calibration step;

loading a second program file that contains executable commands into said main memory of said computer interface, said commands in said second program file being configured to prompt said system control computer to execute said second calibration step;

allocating storage space for at least one of said first program file and said second program file in the main memory of the computer interface; and from said computer interface, informing said system control computer that said first and second calibration steps are to be executed.

3. The method as claimed in claim 1 wherein said one of said scanner components that is to execute each of said first and second calibration steps is a radiofrequency (RF) control processor that operates an RF antenna of said MR scanner, and wherein said first calibration step comprises adjustment of a center frequency of an RF pulse radiated by said antenna that is set in said RF control processor, and wherein said second calibration step comprises adjustment of a voltage of said RF pulse.

4. The method as claimed in claim 1 comprising:

in said computer interface, preparing a third calibration step in which a polarization field generated by a basic field magnet of said MR scanner will be adjusted relative to said examination subject to cause a change in the polarization field produced by the examination subject to be minimized, with said preparation step being completed by said computer interface before one of said first, second or third calibration steps is initiated by said system control computer.

5. The method as claimed in claim 4 comprising, in said system control computer, executing said first calibration step before said second calibration step, and executing said second calibration step before said third calibration step.

6. The method as claimed in claim 4 comprising, after said third calibration step, executing a fourth calibration step in which said first calibration step is repeated by said system control computer, and preparing said fourth calibration step in said preparation step executed by said computer interface, with said preparation step being completed by said computer interface before one of said first, second, third or fourth calibration steps is initiated by said system control computer.

7. The method as claimed in claim 1 wherein said one of said components of said MR scanner is a radiofrequency (RF) control processor that operates an RF antenna of the MR scanner to radiate an RF pulse into the examination subject, and wherein said first calibration step comprises a first sub-step in which a center frequency of said RF pulse is coarsely determined, followed by said second calibration step wherein a voltage of said RF pulse is adjusted, and wherein, after execution of said second calibration step by said system control computer, a second sub-step of the first calibration step is executed wherein a more precise determination of said center frequency is made that is more precise than said coarse determination, and wherein said preparation step comprises preparing said first and second sub-steps of said first step in said computer interface and completing said preparation step before one of said calibration steps is initiated by said system control computer.

8. A magnetic resonance (MR) apparatus for making a calibration measurement, comprising:

an MR scanner comprising a plurality of scanner components, a computer interface operable by a user, and a system control computer configured to control said scanner components;

said computer interface being configured to execute a preparation step, for an image acquisition by said MR scanner from an examination subject situated in the MR scanner, to prepare a first calibration step that will be executed by the system control computer to adjust a first parameter of one of said scanner components relative to the examination subject, and to prepare a second calibration step, which will also be executed by the system control computer, to adjust a second parameter of one of said scanner components relative to the examination subject;

said computer interface being configured to generate interface signals representing the prepared first and second calibration steps and to emit said interface signals from said computer interface to said system control computer;

said system control computer being configured to use said interface signals to generate control signals that change said MR scanner from an uncalibrated state to a calibrated state in order to operate said MR scanner in said calibrated state so as to execute said first calibration step and said second calibration step, and to emit said control signals from said system control computer to said MR scanner and thereby initiating execution of said first and second calibration steps by said MR scanner with said preparation step being completed in said computer interface before one of said first and second calibration steps is initiated by said system control computer; and said system control computer being configured to operate said MR scanner in said calibrated state in order to obtain MR data from the examination subject, and to reconstruct image data from the acquired MR data, and to display the image data at a display screen as an MR image of the examination subject.

9. The magnetic resonance apparatus as claimed in claim 8 wherein said computer interface is configured to execute, in said preparation step, at least one of:
   load a first program file that contains executable commands into a main memory of said computer interface, said commands in said first program file being configured to prompt said system control computer to execute said first calibration step;
   load a second program file that contains executable commands into said main memory of said computer interface, said commands in said second program file being configured to prompt said system control computer to execute said second calibration step;
   allocate storage space for at least one of said first program file and said second program file in the main memory of the computer interface; and
   from said computer interface, inform said system control computer that said first and second calibration steps are to be executed.

10. The magnetic resonance apparatus as claimed in claim 9 wherein said MR scanner comprises a real-time clock configured to clock at least some of said components of said MR scanner.

11. The magnetic resonance apparatus as claimed in claim 8 wherein said components of said MR scanner that are operated by said system control computer are selected from the group consisting of a radiofrequency (RF) control processor configured to operate an RF antenna to emit an RF pulse having an adjustable voltage and an adjustable center frequency, and a magnetic field control unit configured to adjust a polarization field of said MR scanner by producing adjustable compensatory magnetic fields.

* * * * *